(12) United States Patent
Kanemitsu et al.

(10) Patent No.: US 7,572,649 B2
(45) Date of Patent: Aug. 11, 2009

(54) DEVICE TRANSFERRING SYSTEM, DEVICE TRANSFERRING METHOD, AND DISPLAY MANUFACTURING METHOD

(75) Inventors: Toshiaki Kanemitsu, Kanagawa (JP); Yuji Nishi, Kanagawa (JP); Katsuhiro Tomoda, Kanagawa (JP); Masato Doi, Kanagawa (JP)

(73) Assignee: Sony Corporation, Tokyo (JP)

( * ) Notice: Subject to any disclaimer, the term of this patent is extended or adjusted under 35 U.S.C. 154(b) by 421 days.

(21) Appl. No.: 11/383,892

(22) Filed: May 17, 2006

(65) Prior Publication Data

US 2006/0270188 A1 Nov. 30, 2006

(30) Foreign Application Priority Data

May 20, 2005 (JP) ............................ P2005-147658

(51) Int. Cl.
*H01L 21/00* (2006.01)
(52) U.S. Cl. ........................................ 438/14; 438/455
(58) Field of Classification Search ......... 438/455–459, 438/14, 5
See application file for complete search history.

(56) References Cited

U.S. PATENT DOCUMENTS

2005/0233504 A1 10/2005 Doi et al.

FOREIGN PATENT DOCUMENTS

| JP | 2004-273596 | 9/2004 |
|----|-------------|--------|
| JP | 2004-281630 | 10/2004 |

*Primary Examiner*—Richard A. Booth
(74) *Attorney, Agent, or Firm*—K&L Gates LLP

(57) ABSTRACT

A device transferring system includes a first substrate support portion on which to mount a first substrate, a second substrate support portion for supporting a second substrate opposed to the first substrate, a swinging unit for regulating the position of the first substrate support portion so that a device on the first substrate makes contact with the second substrate side in parallel to the second substrate, a movable stage for supporting and moving the swinging unit, a sensor unit for sensing the condition where the device on the first substrate has made contact with the second substrate side, the sensor unit being provided between the first substrate support portion and a sensor support portion formed in the swinging unit, and a measuring unit 61 for measuring the position of stop of a motion of the first substrate due to the contact of the first substrate with the second substrate, and for measuring the moving amount of the swinging unit after the approaching motion of the first substrate is stopped.

7 Claims, 8 Drawing Sheets

DEVICE TRANSFERRING SYSTEM, DEVICE TRANSFERRING METHOD, AND DISPLAY MANUFACTURING METHOD

CROSS REFERENCES TO RELATED APPLICATIONS

The present application related to Japanese Patent Application P2005-147658 filed with the Japanese Patent Office on May 20, 2005, the entire contents of which is being incorporated herein by reference.

BACKGROUND

The present invention relates to a device transferring system, a device transferring method, and a display manufacturing method such that correction of parallelism between substrates is easy to achieve, in a technology wherein devices bonded to an adhesive layer formed on a first substrate are transferred from the first substrate side to the side of a second substrate by embedding the devices in an uncured resin layer formed on the second substrate.

There has been known a technology wherein devices bonded to an adhesive layer formed on a first substrate are transferred from the first substrate side to the side of a second substrate by embedding the devices in an adhesive layer (for example, an uncured resin layer) formed on the second substrate (see, for example, Japanese Patent Laid-open No. 2004-273596 and No. 2004-281630). In the embedding transfer technology, the first substrate and the second substrate are set as parallel as possible to each other, the first and second substrates are made to approach each other while maintaining the parallel condition, and only the devices on the first substrate are brought into uniform contact with the resin layer formed on the second substrate, whereby the devices are transferred from the first substrate side to the second substrate side.

In this case, if the first and second substrates make direct contact with each other due to such reason as bad parallelism between the first and second substrates, the adhesive layer on the first substrate and the adhesive layer on the second substrate would stick to each other, making it difficult to separate the first and second substrates from each other. If the first and second substrates in this condition are forcibly separated from each other, the adhesive layer on the second substrate would be damaged, resulting in a conspicuously bad transfer quality.

Therefore, in the embedding transfer, the accuracy in correction of parallelism for making the first substrate and the second substrate parallel to each other is important.

As a method for correction of parallelism between two substrates, there has hitherto been adopted a method in which the substrates are directly mechanically pressed against each other so as to cause the substrate on one side to accord to the substrate on the other side, or a method in which the two substrates are pressed toward each other in the condition where spherical spacers with a very high dimensional accuracy are clamped between the substrates (see, for example, Bond Aligner BA6 [online], 2002, Suss MicroTec K.K., Home page, Site map, Introduction of products, Substrate bonder/aligner, BA6 Bond Aligner, [searched on Mar. 31, 2005], Internet <URL: http://www.sussjp/html/ba6.html/>; and Suss MicroTec K.K. (formerly Karl Suss Japan K.K.) "Substrate Bonder/Aligner, BA6 Bond Aligner Pamphlet", 2002). However, the direct pressing method is inappropriate, as has been mentioned above. In addition, the method of pressing the substrates toward each other with the spherical spacers clamped therebetween is also inappropriate, since the place for inserting the spacers is not secured in the case where the transfer area on the second substrate is greater as compared with the first substrate.

SUMMARY

Thus, in the technology wherein devices bonded to a pressure sensitive adhesive layer on a first substrate are transferred from the first substrate side to the side of a second substrate by embedding the devices in an uncured resin layer on the second substrate, there is the problem that it is impossible to correct the parallelism between the first and second substrates without making contact with the first and second substrates.

In order to solve the above problem, according to an embodiment of the present invention, there is provided a device transferring system for bonding to a second substrate a device bonded to a first substrate, including: a first substrate support portion on which to mount the first substrate; a second substrate support portion for supporting the second substrate disposed oppositely to the first substrate; a swinging unit for regulating the position of the first substrate so that the device bonded to the first substrate makes contact with the second substrate side in parallel to the second substrate side; a movable stage for supporting and moving the swinging portion; a sensor unit for sensing the condition where the device bonded to the first substrate has made contact with the second substrate side, the sensor unit provided between the first substrate support portion and a sensor support portion formed on the swinging unit side; and a measuring unit for measuring the position of stop of a motion of the first substrate when the first substrate is made to approach the second substrate, and for measuring the moving amount of the swinging unit after the first substrate is stopped.

In the device transferring system as above, since the swinging unit for regulating the position of the first substrate support portion is provided, a fine regulation of the position of the first substrate mounted on the first substrate support portion ensures that the first substrate is disposed in parallel to the second substrate. In addition, since the movable stage for supporting and moving the swinging unit is provided, the first substrate supported on the movable stage through the swinging unit and the first substrate support portion can be moved to a desired position directly below the second substrate. Besides, since the sensor unit for sensing the condition where the device bonded to the first substrate has made contact with the second substrate side is provided, the start of contact of the device with the second substrate side is detected by reading an increase in the value measured by the sensing unit when the first substrate is moved toward the second substrate in order to bond the device to the second substrate side. Further, the position of the swinging unit at the time when the device bonded to the first substrate makes contact with the second substrate is measured as a reference position by the measuring unit, and the moving amount of the swinging unit after the contact is measured by the measuring unit. Then, when the moving amount of the swinging unit from the reference position is within a predetermined range, for example, within such a range that the first substrate and the second substrate can be regarded as parallel to each other, the first substrate and the second substrate are in such positions that they can be regarded as parallel to each other. On the other hand, when the moving amount of the swinging unit from the reference position is not within the predetermined range, the swinging unit is moved further so as to obtain a new moving amount, whereby the moving amount of the swinging unit from the reference position can be brought into the predetermined range. Thus, in the device transferring system according to an embodiment of the present invention, the device can be bonded to the second substrate side under the condition where the first substrate with the device bonded thereto and the second substrate to which to transfer the device have been made to approach each other so that the first and second substrates can be regarded as parallel to each other, and, accordingly, the device can be assuredly transferred to the second substrate side. In this case, the first substrate and the second substrate do not make contact with each other.

According to another embodiment of the present invention, there is provided a device transferring method for bonding a plurality of devices bonded to a first substrate to an adhesive layer formed on a second substrate, including: a substrate approach step for causing the plurality of devices bonded to the first substrate to approach the adhesive layer formed on the second substrate; a device contact step for regulating the position of the first substrate to make the first substrate parallel to the second substrate while keeping at least a part of the plurality of devices bonded to the first substrate in contact with the adhesive layer formed on the second substrate, thereby to bring all of the plurality of devices into contact with the adhesive layer; and a device bonding step for bonding the plurality of devices bonded to the first substrate to the adhesive layer formed on the second substrate in the condition where the devices are in contact with the adhesive layer.

In the device transferring method as above, after the first substrate and the second substrate have been made to approach each other, the position of the first substrate is regulated so as to make the first and second substrates parallel to each other while keeping at least a part of the plurality of devices adhered to the first substrate in contact with the adhesive layer formed on the second substrate, whereby the first substrate can be disposed in parallel to the second substrate, and all of the plurality of devices can be uniformly bonded to the adhesive layer on the second substrate side. Therefore, all of the plurality of devices can be brought into contact with the adhesive layer. In this case, the devices bonded to the first substrate are bonded to the adhesive layer formed on the second substrate, in the condition where the first substrate and the second substrate are not in contact with each other.

According to a further embodiment of the present invention, there is provided a display manufacturing method for arrangingly mounting a plurality of light emitting devices by bonding the light emitting devices bonded to a first substrate to an adhesive layer formed on a second substrate, wherein a device transferring method for bonding the plurality of devices bonded to the first substrate to the adhesive layer formed on the second substrate includes: a substrate approach step for causing the plurality of devices bonded to the first substrate to approach the adhesive layer formed on the second substrate; a device contact step for regulating the position of the first substrate so as to cause all of the plurality of devices bonded to the first substrate to make uniform contact with the adhesive layer formed on the second substrate while keeping at least a part of the plurality of devices in contact with the adhesive layer, thereby to bring all of the plurality of devices into contact with the adhesive layer; and a device bonding step for bonding the devices bonded to the first substrate to the adhesive layer formed on the second substrate in the condition where the devices are in uniform contact with the adhesive layer.

In the display manufacturing method as above, the devices bonded to the first substrate are bonded to the second substrate to be a substrate of the display by the device transferring method in the present invention, so that the same effects as that of the above-described device transferring method can be obtained. Namely, the first substrate can be disposed in parallel to the second substrate, so that the devices bonded to the first substrate are bonded to the adhesive layer formed on the second substrate, in the condition where the first substrate and the second substrate are not in contact with each other.

In the device transferring system in the present invention, since the movable stage is provided, the first substrate can be easily moved to a desired position directly below the second substrate. In addition, since the sensor unit is provided, the contact of the device with the second substrate side can be easily detected. Further, since the swinging unit is provided, the first substrate and the second substrate can be easily arranged in parallel to each other in the condition where the device is in contact with the second substrate side. Besides, since the measuring unit for measuring the moving amount of the swinging unit is provided, the operating amount for pressing the device against the second substrate side can be set to an appropriate operating amount by operating the swinging unit, and the device can be uniformly embedded into the second substrate side at an appropriate pressure. In addition, since the first substrate and the second substrate are in parallel to each other, the substrates do not make contact with each other, so that the device on the first substrate side can be pressed against the second substrate side, without damaging the second substrate. Therefore, enhancement of yield in the device transferring technology can be contrived.

In the device transferring method in the present invention, after the first substrate and the second substrate have been made to approach each other, the position of the first substrate is regulated so as to make the first substrate and the second substrate parallel to each other while keeping at least a part of the plurality of devices bonded to the first substrate in contact with the adhesive layer formed on the second substrate, so that the first substrate and the second substrate can be easily arranged in parallel to each other. Therefore, all of the plurality of devices can be set parallel to the second substrate and be bonded to, for example, a uniform depth in the adhesive layer. In this case, since the first substrate and the second substrate are parallel to each other, the substrates do not make contact with each other. Therefore, the devices on the first substrate side can be pressed against the second substrate side, without damaging the second substrate. Accordingly, enhancement of the yield in the device transferring technology can be contrived.

In the display manufacturing method in the present invention, the first substrate and the second substrate are kept parallel to each other in transferring the devices on the first substrate side to the second substrate side, so that the substrates do not make contact with each other. Therefore, the devices on the first substrate side can be pressed against the second substrate side, without damaging the second substrate. Accordingly, enhancement of the yield in manufacturing the display by use of the device transferring technology can be contrived.

Additional features and advantages are described herein, and will be apparent from, the following Detailed Description and the figures.

DETAILED DESCRIPTION

The aim to hold in parallel a first substrate with a device mounted thereon and a second substrate to which to transfer the device and to embed the device on the first substrate into an adhesive layer (for example, an uncured resin layer) formed on the second substrate is realized by detecting the condition of contact of the device with the second substrate side by a sensor unit and finely adjusting the parallelism between the substrates by a swinging unit while measuring the distance between the substrates by a measuring unit.

An example of an embodiment of the device transferring system in the present invention will be described below, referring to the schematic configuration diagram shown in FIG. 1, the enlarged diagram of an essential part shown in FIG. 2, and the plan layout diagram shown in FIG. 3.

Figure 1:
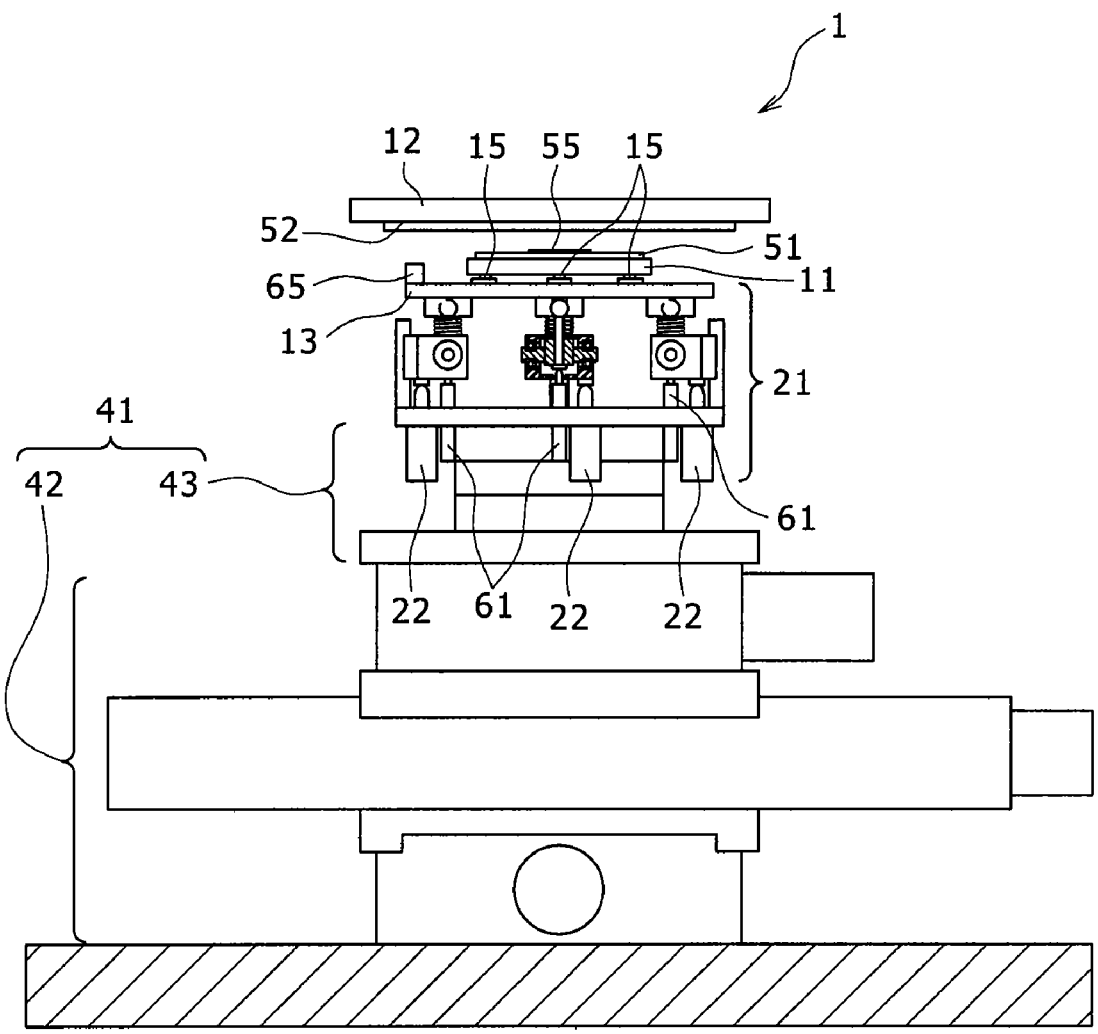
FIG. 1 is a schematic configuration diagram showing an example of an embodiment of the device transferring system in the present invention.
Figure 1:
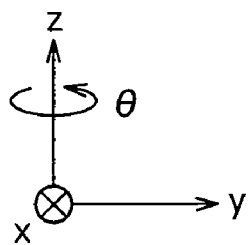
Figure 2:
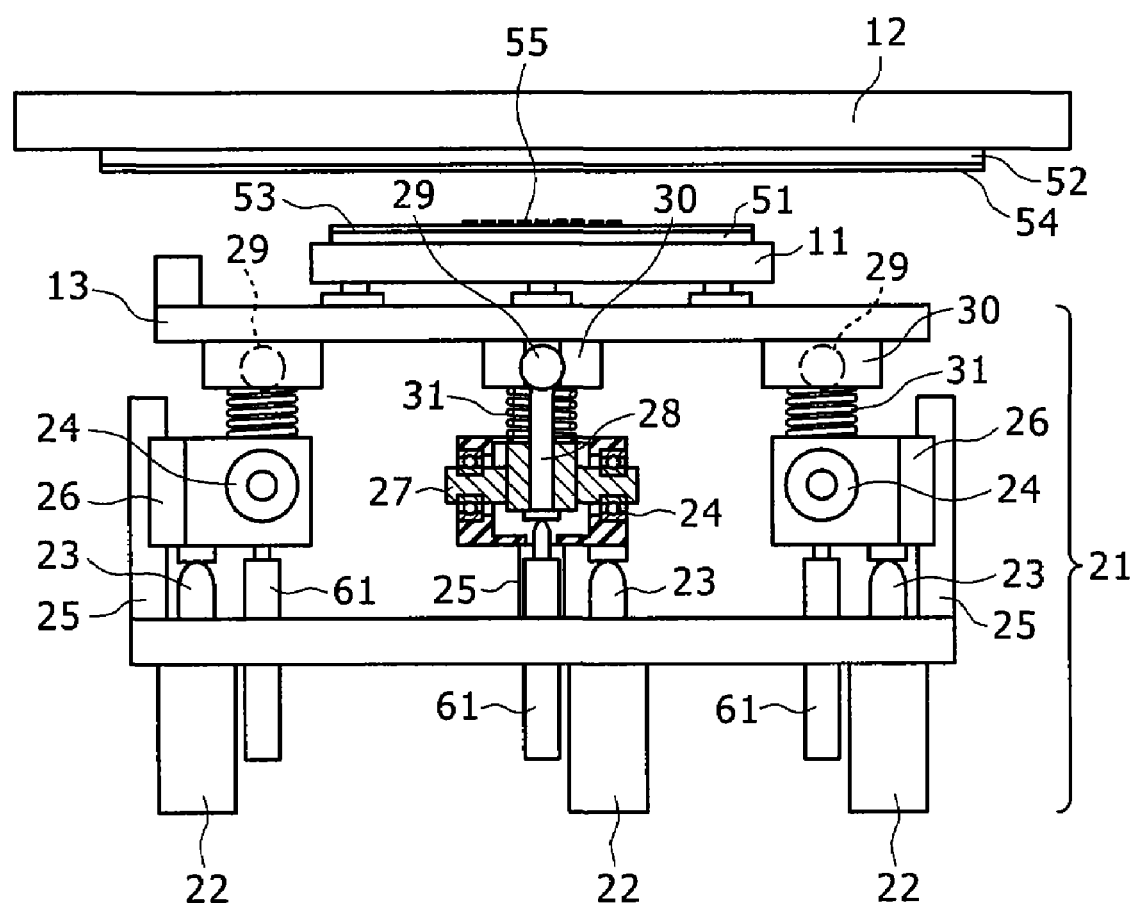
FIG. 2 is an enlarged view of an essential part showing an example of an embodiment of the device transferring system in the present invention.
Figure 3:
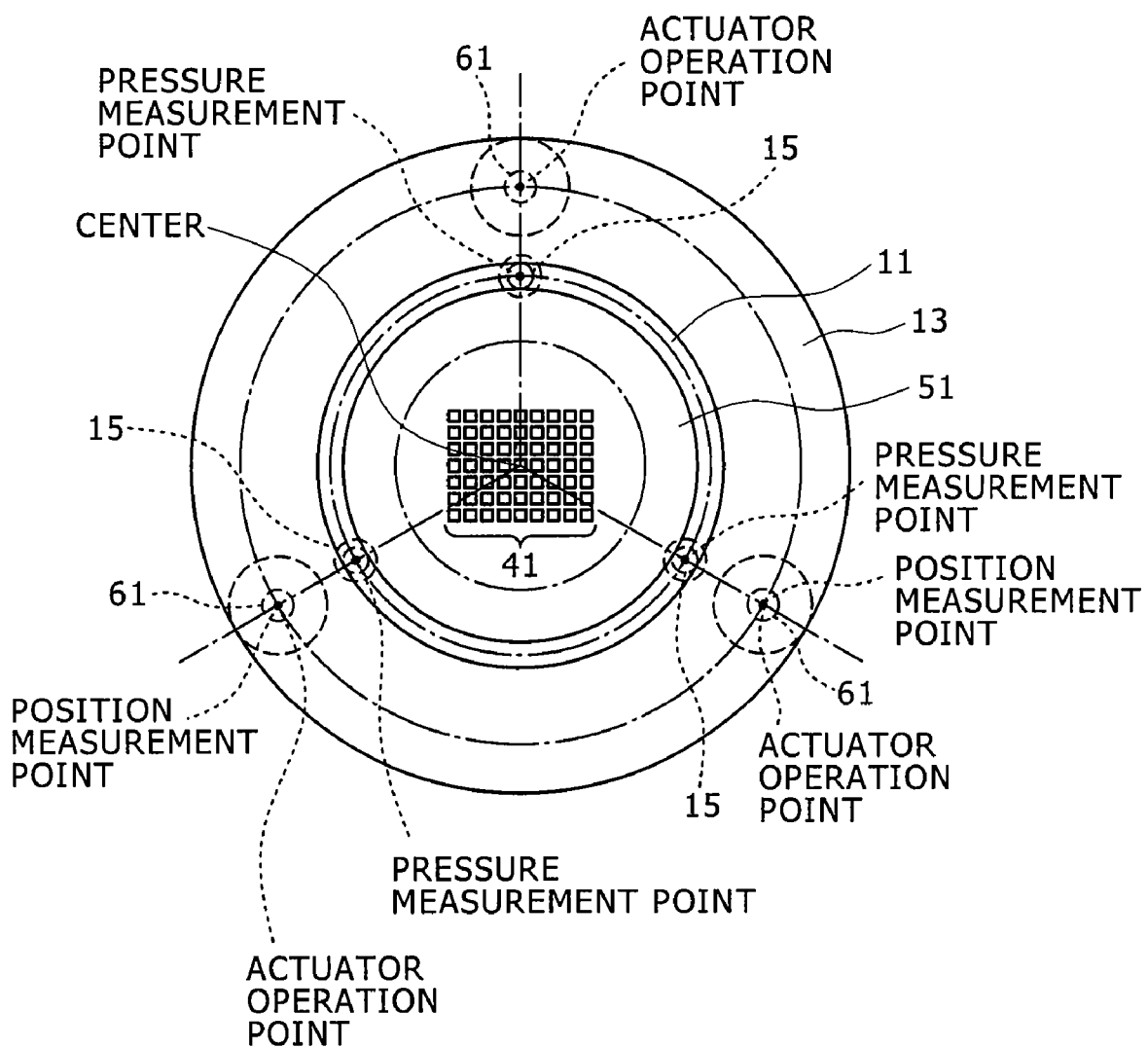
FIG. 3 is a schematic configuration plan view showing an example of an embodiment of the device transferring system in the present invention.

As shown in FIGS. 1 to 3, the device transferring system 1 includes: a first substrate support portion 11 on which to mount a first substrate 51; a second substrate support portion 12 for supporting a second substrate 52 disposed so as to face the first substrate 51; a swinging unit 21 for regulating the position of the first substrate support portion 11 so that the device 55 bonded to the first substrate 51 makes contact with the second substrate 52 side in parallel to the latter; a movable stage 41 for supporting the swinging unit 21, the movable stage 41 being movable in x, y, z, and θ directions, for example; a sensor unit 15 for sensing the condition where the device 55 bonded to the first substrate 51 has made contact with the second substrate 52 side, the sensor unit 15 provided between the first substrate support portion 11 and a sensor support portion 13 formed on the first substrate support portion 11 side of the swinging unit 21; and a measuring unit 61 for measuring the position of stop of a motion of the first substrate 51 due to the contact of the first substrate 51 with the second substrate 52 when the first substrate 51 is caused to approach the second substrate, and for measuring the moving amount of the swinging unit 21 after the first substrate 51 is stopped.

The movable stage 41 has the functions of preliminarily measuring the position of the swinging unit 21 at the position of contact of a first substrate serving as a reference (first master substrate) (not shown) and a second substrate serving as a reference (second master substrate) (not shown) with each other, obtaining the measured position as a reference position, and arranging the swinging unit 21 within a predetermined range from the reference position.

For example, the movable stage 41 is composed of a rough movement stage 42 and a fine movement stage 43. The rough movement stage 42, basically, is composed of a stage capable of swiftly moving over long distances (for example, several tens of centimeters to about 2 m) in, for example, the x, y, z, and θ directions. This ensures that the loading, unloading, and movement to a tiling site, of the first substrate 51 can be performed at high speeds. On the other hand, the fine movement stage 43 is basically composed of a stage capable of finely moving over short distances (for example, several micrometers to several millimeters) in, for example, the x, y, z, and θ directions. This realizes a high resolution and a high stop position accuracy at the time of alignment. Alternatively, a configuration can be adopted in which a part of the motion of the rough movement stage 42 and the motion of the fine movement stage 43 are realized in common. For example, a motion of the rough movement stage 42 in the θ direction and a motion of the fine movement stage 43 in the θ direction can be realized in common. Besides, a motion of the fine movement stage 43 in the z direction and a motion of the swinging unit 21 in the Z direction, which will be described in detail later, can be realized in common. Incidentally, the x direction, y direction and z direction herein refer to the axes in a three-dimensional rectangular coordinate system, and the θ direction is the direction of rotation about the z axis in the x-y plane.

In addition, the movable stage 41 may have the function of separating the first substrate 52 away from the device 55 in the condition where the device 55 has been bonded to an adhesive layer 54 formed on the second substrate 52. This motion can be realized simply by a downward motion, among motions along the z direction, of the movable stage 41.

The movable stage 41 can move the first substrate 51 to a predetermined position directly below the second substrate 52, through the swinging unit 21. Therefore, by the movable stage 41, the first substrate 51 can be moved to a desired position relative to the second substrate 52.

The swinging unit 21 is supported by the movable stage 41, and is for performing such an adjustment that the first substrate 51 moved to the predetermined position directly below the second substrate 52 by the movable stage 41 and the second substrate 52 supported on the second substrate support portion 12 will be parallel to each other. Details of the mechanism of the swinging unit 21 will be described below.

The swinging unit 21 is for positioning the first substrate 51 in parallel to the second substrate 52, and is equipped with three actuators 22 which are provided on the movable stage 41 and which are capable of up-down motions (lifting motions) in one axial direction (for example, in the z axis direction). The actuators 22 are laid out at positions corresponding to the apexes of a triangle. Normally, a process of supporting a substrate and adjusting the inclination of the substrate can be achieved by supporting the substrate at three points. Therefore, in this embodiment, also, the first substrate support portion 11 is supported at three positions by the three actuators 22. Preferably, the supporting points are located at the apexes of an equilateral triangle the center of which coincides with the center of the first substrate support portion 11, as shown in FIG. 3. Incidentally, the first substrate support portion 11 may be supported at four or more points; in the case of four-point support, however, the contact between the actuators 22 and the first substrate support portion 11 may be attained at three points and non-contact may occur at the remaining one point. Thus, it suffices to adopt three supporting points. In addition, with the supporting points located at the apexes of an equilateral triangle whose center coincides with the center of the first substrate support portion 11, it becomes easier to adjust the inclination of the first substrate 51 through the first substrate support portion 11. Besides, for enhancing the accuracy of the fine adjustment, the sensor support portion 13 which is larger than the first substrate support portion 11 is provided on the lower side (on the side opposite to the side where the first substrate 51 is supported) of the first substrate support portion 11, as shown in the figure. In this case, spherical bearings 30 which will be described below may be provided on the back side (on the side opposite to the side where the first substrate support portion 11 is fixed) of the sensor support portion 13 as shown, or may be provided on the face side (on the side where the first substrate support portion 11 is fixed through the sensor unit 15) of the sensor support portion 13 inasmuch as the spherical bearings 30 are so located as not overlap with the sensor unit 15. In the latter case, it may be necessary to provide the sensor support portion 13 with holes (not shown) permitting non-contact penetration therethrough of rocking shafts 28 which will be described later. In this way, the positions where the spherical bearings 30 are mounted can be appropriately selected on a mechanism design basis.

A movable tip end portion of each of the actuators 22 is configured as follows. A turning bearing 24 is provided at the tip end of a drive shaft 23 of the actuator 22, and the turning bearing 26 is provided with a translational bearing 26 liftably supported on a translational shaft 25 fixed on the movable stage 41. A turning shaft 27 is turnably supported on the turning bearing 24, and the rocking shaft 28 orthogonal to the turning shaft 27 is formed at the center of the turning shaft 27. Therefore, the turning shaft 27 and the rocking shaft 28 are formed in a T-shaped form. A tip end portion of the rocking shaft 28 is formed in a spherical shape, and the spherical bearing 30 for accommodating the spherical portion 29 is provided on the back surface (the surface on the opposite side of a surface for supporting the first substrate 51) of the first substrate support portion 11. In the drawings, since the sensor support portion 13 is provided as described above, the spherical bearings 30 are provided in the sensor support portion 13.

In addition, an elastic portion 31 is provided around the rocking shaft 28, serving as a drive shaft for the actuator 22, and between the turning shaft 24 and the spherical bearing 30. The elastic portion 31 is for absorbing a moving amount of the actuator 22 relative to the first substrate 51 in the case where the device 52 bonded to the first substrate 51 is brought into contact with the second substrate 53 side by the operation of the actuator 22 and thereafter the actuator 22 is operated further in the direction for pressing the first substrate 51 toward the second substrate 52 side. The elastic unit 31 is composed, for example, of a coil spring.

Therefore, the swinging unit 21 operates as follows. By an upward motion of the actuator 22, the turning bearing 24 is slidably supported by the translational bearing 26 and is moved upwards. In this instance, the turning shaft 27 and the rocking shaft 28 are also moved upward simultaneously. Then, the spherical bearing 30 pushed up by the spherical portion 29 provided in the rocking shaft 28 is moved upward, and the sensor support portion 13 disposed at the spherical bearing 30 is also pushed up at a portion where the actuator 22 operates. The upward motion of each actuator 22 is so regulated that the first substrate 51 mounted on the sensor support portion 13 through the sensor unit 15 and the first substrate support portion 11 will be parallel to the second substrate 52. Therefore, differences may be generated among the moving amounts of the actuators 22.

For example, in the case where the moving amount of the first actuator 22 (22a) and the moving amount of the second actuator 22 (22b) are equal and are longer than that of the third actuator 22 (22c), the sensor support portion 13 is inclined, with the spherical bearing 30 connected to the third actuator 22c as a fulcrum of turning. Therefore, the spherical bearing 30 connected to the first actuator 22 (22a) and the spherical bearing 30 connected to the second actuator 22 (22b) are not moved upward simply to the directly upper side, like in the case where the moving amounts of the actuators 22 are equal, but are moved skewly upward according to the inclination of the sensor support portion 13. The skewly upward motion is followed up by a rotating motion of the spherical portion 29 serving as an operating end of the actuator 22 relative to the spherical bearing 30 and a turning motion of the turning shaft 27 supporting the rocking shaft 28 relative to the turning bearing 24.

The first substrate support portion 11 for supporting the first substrate 51 on which the device 55 to be transferred to the second substrate 51 side is bonded is mounted on the swinging portion 21. In addition, the second substrate support portion 12 for supporting the second substrate 52 disposed so as to face the first substrate 51 supported on the first substrate support portion 11 is provided on the upper side of the first substrate support portion 11.

Incidentally, since in the swinging unit 21 upward and downward motions (lifting) in the z axis direction can be performed by the actuators 22, the upward and downward motions can be substituted for motions of the movable stage 41 along the z axis direction. In this case, the moving mechanism for moving in the z axis direction can be omitted from the movable stage 41.

The sensor unit 15 is for sensing the condition where the device 55 bonded to the first substrate 51 has made contact with the second substrate 52 side, and is provided between the first substrate support portion 11 and the sensor support portion 13 formed on the first substrate support portion 12 side of the swinging unit 21. The sensor unit 15 can be composed, for example, of a load sensor for measuring the load exerted when the device 55 bonded to the first substrate 51 is pressed against the second substrate 52 side.

In addition, the measuring unit 61 is for measuring the position of stop of a motion of the first substrate 51 due to the contact of the first substrate 51 with the second substrate 52 when the first substrate 51 is made to approach the second substrate 52, and for measuring the moving amount of the swinging unit 21 after the first substrate 51 is stopped, and is provided one for each actuator 22. The measuring unit 61 can be composed, for example, of a linear scale capable of reading a displacement amount.

The substrate supporting method as to the first substrate support portion 11 and the second substrate support portion 12 may be mechanical support, support by vacuum suction, or other means. In short, the first substrate support portion 11 may be any means by which the first substrate 51 can be supported and fixed, and the second substrate support portion 12 may be any means by which the second substrate 52 can be supported and fixed.

In the device transferring system 1, for example, on the upper side of the second substrate support portion 12, an alignment unit 65 is arranged for positioning the first substrate 51, by the first substrate support portion, at a predetermined position relative to the second substrate 52 supported on the second substrate support portion 12. The alignment unit 65 is, for example, for aligning the first substrate 51 relative to the second substrate 52 by moving the movable stage 41 so that an alignment mark or marks formed on the first substrate 51 will accord to an alignment mark or marks formed on the second substrate 52.

In the device transferring system 1, in order to smoothly moving the first substrate 51 to the predetermined position directly below the second substrate 52 by the movable stage 41, it is preferable to preliminarily conduct a pre-leveling operation using the first master substrate and the second master substrate at each moving position of the first substrate 51 relative to the second substrate 52, and thereby to preliminarily set moving positions of the movable stage 41. By conducting such a pre-leveling operation, the alignment operation for aligning the first substrate 51 relative to the second substrate 52 can be performed swiftly.

The pre-leveling operation is conducted as follows. First, the first master substrate (not shown) and the second master substrate (not shown) are prepared. As the master substrates, substrates high in dimensional accuracies (particularly, dimensional accuracies as to thickness and flatness) are used. The first master substrate is mounted on the first substrate support portion 11. Similarly, the second master substrate is mounted on the second substrate support portion 12.

Next, the movable stage 41 is driven to move the first master substrate to the lower side of a predetermined position where the first master substrate is brought into contact with the second master substrate. In this instance, the alignment in the x, y, z, and θ directions can also be conducted by the alignment unit.

The operation of moving the actuators 22 in the swinging unit 21 upward is conducted, thereby making the first master substrate approach the second master substrate. In this case, the moving amounts of the actuators 22, the measured values measured by the measuring units 61 consisting of the linear scales attached to the shafts, and the measured values measured by the sensor units 15 consisting of the load sensors are constantly monitored.

Soon, at least a part of the first master substrate makes contact with the second master substrate. For example, if the first master substrate makes contact with the second master substrate at a position of the first master substrate corresponding to one actuator 22a (now, assumed to be the first actuator 22a) of the actuators 22, the sensor unit 15 for sensing the condition where the first master substrate has made contact with the second master substrate reacts to the contact. In other words, it is detected that the load exerted on the first master substrate has got into an increasing direction.

In this instance, the elastic portion 31 provided between the first actuator 22a and the sensor support portion 13 contracts, resulting in that the portion of the first master substrate supported by the first actuator 22a does not show any change even when the first actuator 22a is put into an upward motion. With the master substrates having thus made contact with each other, continuing the operation of the first actuator 22a leads only to contraction of the elastic portion 31; as a result, the first master substrate is not moved upwards, the value obtained in the measuring unit 61 will not show any variation, and a difference begins to be generated between the moving amount of the first actuator 22a and the measured value obtained by the measuring unit 61. Besides, the value obtained by the sensor unit 15 begins to increase.

Before long, all the actuators 22 come into the above-mentioned condition. In this instance, it is judged that the first master substrate and the second master substrate have made contact with each other over the whole area thereof, and the measured values obtained by the measuring units 61 at that time are individually stored.

Subsequently, the first master substrate is moved downward, to the next embedding position, and the above-mentioned series of operations is repeated again. This procedure is performed at all the embedding positions, whereby the pre-leveling is completed. The pre-leveling is preferably carried out at the times when the device transferring system 1 is modified mechanically, electrically, or on a software basis, such as the time when the device transferring system 1 is completed, the time when the device transferring system 1 is installed, and the time when an adjustment of the device transferring system 1 is performed.

Now, the operations of the device transferring system 1 will be described below, referring to FIGS. 1 to 3.

The first substrate 51 is mounted at a predetermined position on the first substrate support portion 11, and the second substrate 52 is mounted at a predetermined position on the second substrate support portion 12.

Then, by the rough movement stage 42 and the fine movement stage 43 of the movable stage 41, the first substrate 51 is moved to be located at a position directly below a predetermined region of the second substrate 52. In this instance, based on the measured position preliminarily obtained by the precedent pre-leveling operation, the first substrate 51 is moved to a position within the range of 100 to 300 μm directly below the second substrate 52.

Next, the actuators 22 are put into upward motions, to cause the first substrate 51 to approach the second substrate 52 side.

In this instance, if a part of the device 55 bonded to the first substrate 51 has made contact with the adhesive layer 54 on the second substrate 52 side at, for example, a position of the first substrate 51 corresponding to one actuator 22 (now, assumed to be the first actuator 22a) of the actuators 22 making the first substrate 51 approach the second substrate 52 side, the sensor unit 15 for sensing the condition where the device 55 has made contact with the second substrate 52 side reacts to the contact. In other words, it is detected that the load exerted on the first substrate 51 has come into an increasing direction. The position of the first actuator 22a at this time point is preliminarily measured by the measuring unit 61.

In this instance, the elastic portion 31 provided between the first actuator 22a and the sensor support portion 13 contracts, so that the part of the first substrate 51 supported by the first actuator 22a will not show any change even when the first actuator 22a is put into an upward motion. During the upward motion of the first actuator 22a, the position of the first actuator 22a in the position of contact between the first substrate 51 and the second substrate 52 preliminarily measured is compared with the current position of the first actuator 22a by the measuring unit 61. If the current position is within a predetermined range from the preliminarily measured position, the upward motion of the first actuator 22a is stopped.

On the other hand, the second actuator 22 (22b) and the third actuator 22 (22c) other than the first actuator 22a are made to continue the operation (motion) for causing the first substrate 51 to approach the second substrate 52 side. Then, for example, when the device 55 bonded to the first substrate 51 has made contact with the adhesive layer 54 on the second substrate 52 side at a position of the first substrate 51 corresponding to one actuator 22 (now, assumed to be the second actuator 22b) of the remaining two actuators 22b and 22c, the sensor unit 15 for sensing the condition where the device 55 has made contact with the second substrate 52 side reacts to the contact. In other words, it is detected that the load exerted on the first substrate 51 has come into an increasing direction. The position of the second actuator 22b at this time point is preliminarily measured by the measuring unit 61.

In this instance, the elastic portion 31 provided between the second actuator 22b and the sensor support portion 13 contracts, so that the portion of the first substrate 51 supported by the second actuator 22b will not show any change even when the second actuator 22b is put into an upward motion. During the upward motion of the second actuator 22b, the position of the second actuator 22b in the position of contact between the first substrate 51 and the second substrate 52 preliminarily measures is compared with the current position of the second actuator 22b by the measuring unit 61. If the current position is within a predetermined range from the preliminarily measured position, the upward motion of the second actuator 22b is stopped.

Finally, the operation of the remaining third actuator 22c for causing the first substrate 51 to approach the second substrate 52 side is continued. Then, when the device 55 bonded to the first substrate 51 has made contact with the second substrate 52 at a position of the first substrate 51 corresponding to the third actuator 22c, the sensor unit 15 for sensing the condition where the device 55 has made contact with the second substrate 52 side reacts to the contact. In other words, it is detected that the load exerted on the first substrate 51 has come into an increasing direction. The position of the third actuator 22c at this time point is preliminarily measured by the measuring unit 61.

In this instance, the elastic portion 31 provided between the third actuator 22c and the sensor support portion 13 contracts, so that the portion of the first substrate 51 supported by the third actuator 22c will not show any change even when the third actuator 22c is put into an upward motion. During the upward motion of the third actuator 22c, the position of the third actuator 22c in the position of contact between the first substrate 51 and the second substrate 52 preliminarily measured is compared with the current position of the third actuator 22c by the measuring unit 61. If the current position is within a predetermined range from the preliminarily measured position, the upward motion of the third actuator 22c is stopped.

In this manner, the device 55 bonded to the first substrate 51 makes contact with the second substrate 52 over the whole region thereof, at all the actuators 22 for the three shafts; thereafter, even if the actuators 22 are put into upward motions, only the elastic portions 31 deform (contract), and the position of the first substrate 51 will not show any change. It is preferable that the loads measured by the sensor units 15 at this time point have a uniform value, but it suffices that the load values are within a predetermined range. In addition, if the values measured by the measuring units 61 are within a predetermined range from the position of contact between the first substrate 51 and the second substrate 52 obtained by the preliminary measurement, it is possible to regard the first substrate 51 and the second substrate 52 as being parallel to each other, and it is judged that the device 55 can be bonded to the second substrate 52 side. Besides, the moving amounts of the actuators 22 substantially are equivalent to the moving amount of the swinging unit 21.

In the device transferring system 1, with the swinging unit 21 provided, the first substrate 51 can be arranged in parallel to the second substrate 52, by fine adjustment of the inclination of the first substrate 51. In addition, with the movable stage 41 provided for moving the swinging unit 21, the first substrate 51 supported on the movable stage 41 through the swinging unit 21 and the first substrate support portion 11 can be moved to a desired position directly below the second substrate 52. Besides, since the measuring units 61 for measuring the gap between the first substrate 51 and the second substrate 52 without making contact with the first substrate 51 and the second substrate 52 are provided, even in the case where adhesive layers (a first adhesive layer 53 and a second adhesive layer 54) are formed on the opposed surfaces of the first substrate 51 and the second substrate 52, the measuring units 61 would make contact with none of the first adhesive layer 53 and the second adhesive layer 54. In the device transferring system 1 having these characteristic features, the device 55 bonded to the first substrate 51 can be pressed against the second substrate 52 side in the state of being parallel to the second substrate 52 side. In this case, the first substrate 51 and the second substrate 52 are set parallel to each other, so that the substrates would not make contact with each other. Therefore, the device 55 on the first substrate 51 side can be pressed against the second substrate 52 side, without possibility of damaging the second substrate 52. Accordingly, enhancement of the yield in the technology for transferring the device 55 can be contrived.

Furthermore, in the device transferring system 1 in the present invention, the correction of parallelism between the first substrate 51 and the second substrate 52 can be achieved even where each of the first substrate 51 and the second substrate 52 is an opaque substrate. Therefore, the device transferring system 1 is characterized by a high degree of freedom in selecting the materials for the first and second substrates. In addition, the correction of parallelism between the first substrate 51 and the second substrate 52 can be done, with no problem, even where devices and wirings and the like are formed on the substrates. Therefore, the degree of freedom in designing the devices formed on the substrates is not influenced by the correction of parallelism between the substrates.

Besides, the first and second substrate support portions 11 and 12 for supporting the substrates may also be opaque substrates, in the same manner as above; therefore, the degree of freedom in selecting the materials for the first and the second substrate support portions 11 and 12 is high. In addition, since each of the first and second substrate support portions 11 and 12 can be formed from a single sheet of substrate, the substrate supporting surfaces of the first and second substrate support portions 11 and 12 can be precisely machined to have high degrees of flatness, the accuracy in correcting the parallelism in the condition where the substrates are supported on the substrate support portions can be enhanced.

Now, an example of an embodiment of the device transferring method in the present invention will be described below, referring to the flowchart shown in FIG. 4.

The device transferring method in the present invention is a device transferring method for bonding a plurality of devices 55 bonded to a first substrate 51 through a first adhesive layer 53 to an adhesive layer 54 formed on a second substrate 52, including: a substrate approach step for causing the plurality of devices 55 bonded to the first substrate 51 to approach the adhesive layer 54 formed on the second substrate 52; a device contact step for regulating the position of the first substrate 51 to make the first substrate 51 parallel to the second substrate 52 while keeping at least a part of the plurality of devices 55 bonded to the first substrate 51 in contact with the adhesive layer 54 formed on the second substrate 52, thereby to bring all of the plurality of devices 55 into contact with the adhesive layer 54; and a device bonding step for bonding the plurality of devices 55 bonded to the first substrate 51 to the adhesive layer 54 formed on the second substrate 52 in the condition where the devices 55 are in contact with the adhesive layer 54. The device transferring method will be described in detail below.

Figure 4:
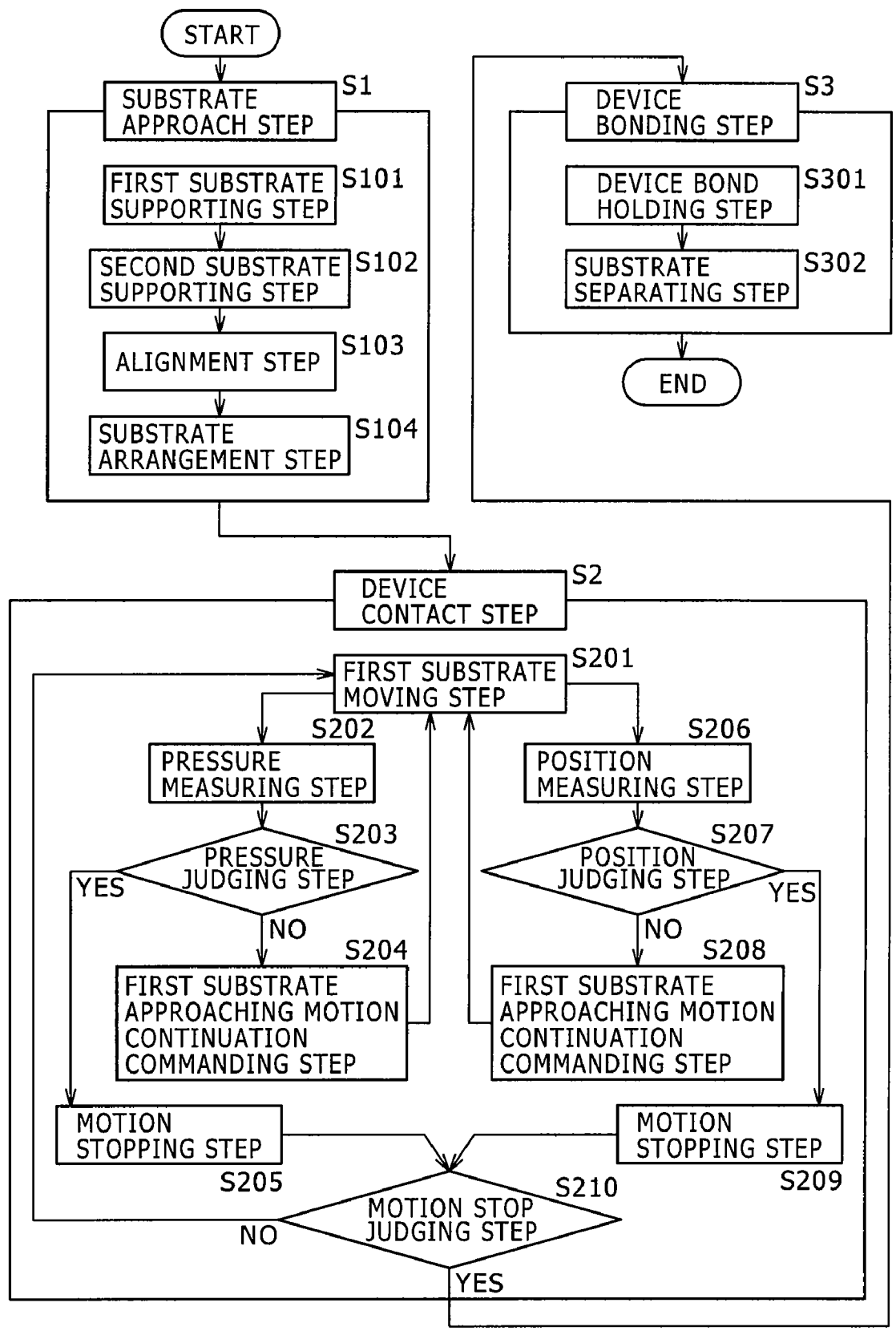
FIG. 4 is a flowchart showing an example of an embodiment of the device transferring method in the present invention.

As shown in FIG. 4, "a substrate approach step" S1 is conducted. In this step, first, "a first substrate supporting step" S101 is carried out. In this step, the first substrate 51 is supported on the first substrate support portion 11. In the supporting method, for example, with the face side (the first adhesive layer 53 side) of the first substrate 52 on the upper side, and with the back side of the first substrate 52 on the first substrate support portion 11 side, the first substrate 51 is supported by being fixed by vacuum suction or mechanically. In addition, as the first substrate 51, for example, a substrate with a diameter φ of about 30 to 200 mm (8 in) is used. Besides, the devices 55 bonded to the first adhesive layer 53 formed on the face side of the first substrate 51 have, for example, a size of about 3 to 300 μm and a height of about 3 to 300 μm. In addition, the number of the devices 55 bonded to the first substrate 51 is about 10 to one million.

Next, "a second substrate supporting step" S102 is conducted. In this step, the second substrate 52 is supported on the second substrate support portion 12. In the supporting method, for example, with the face side (the second adhesive layer 54 side) of the second substrate 52 on the lower side, and with the back side of the second substrate 52 on the second substrate support portion 12 side, the second substrate 52 is supported by being fixed by vacuum suction or mechanically. As the second substrate 52, for example, a substrate with a diameter φ of about 50 mm (2 in) to 2 m square is used. Incidentally, a substrate larger than that of the 2 m silicon process may also be used as the second substrate 52. In addition, the second adhesive layer 54 is formed on the face side of the second substrate 52. The second adhesive layer 54 has an adhesive force for adhesion to the devices 55 greater than that of the first adhesive layer 53 to which the devices 55 are bonded. Besides, the second adhesive layer 54 formed on the second substrate 53 is composed, for example, of an uncured resin layer, which is formed, for example, by a process in which a resist film high in the so-called tack is formed by a film forming method such as a spin coating method, a printing method, a laminating method, etc. Incidentally, either one of "the first substrate supporting step" S101 and "the second substrate supporting step" S102 may be carried out prior to the other one.

Subsequently, "an alignment step" S103 is conducted. In this step, the first substrate 51 and the second substrate 52 are opposed to each other, with a predetermined distance therebetween. Specifically, based on the measurement by the alignment unit 65, the movable stage 41 is moved, for example, in the x-y directions and the θ direction so as to move the first substrate 51 to a predetermined position directly below the second substrate 52.

Further, "a substrate arrangement step" S104 is conducted. In this step, the first substrate 51 is moved, for example, in the z direction by the movable stage 31, to arrange the first substrate 51 relative to the second substrate 52 in such a manner that the first substrate 51 is disposed within a predetermined range from a reference position, which is an estimated position for contact of the first substrate 51 with the second substrate 52 and which is preliminarily obtained by pre-leveling. The pre-leveling is as has been described above. For example, the gap between the first substrate 51 and the second substrate 52 is reduced to a value equal to the height of the devices 55 plus about 30 to 100 μm. Thereafter, "the alignment step" S103 is again conducted, for alignment in the x direction, the y direction, and the θ direction, preferably.

Next, "the device contact step" S2 is conducted. In this step, by use of the sensor units 15 of the device transferring system 1, the pressure exerted on the first substrate 51 which is generated upon contact of the devices 55 bonded to the first substrate 51 with the second substrate 52 side is measured. By measuring the pressure, it is detected that the devices 55 have made contact with the second substrate 52.

Simultaneously, the first substrate 51 and the second substrate 52 are adjusted to be parallel to each other, by use of the swinging unit 21. The swinging unit 21 includes the actuators 22 (22*a*, 22*b* and 22*c*) supporting the positions, corresponding to apexes of a triangle, on the surface of the first substrate 51 and lifting (moving vertically) the first substrate 51, and the elastic portions 31 each provided between each actuator 22 and the first substrate 51 side. For example, when the actuators 22 are operated in the direction for pressing the first substrate 51 toward the second substrate 52 side, the positions of the actuators 22 upon contact of the devices 55 bonded to the first substrate 51 with the second substrate 52 side are obtained as actuator reference positions. Further, the moving amounts of the actuators 22 when the actuators 22 are operated are measured. These measurements are carried out by use of the measuring units 61. Then, the moving amounts of the actuators 22 are so regulated that the moving amounts of the actuators 22 from the reference positions will be within a predetermined range, whereby the first substrate 51 and the second substrate 52 are adjusted to be parallel to each other.

Now, "the device contact step" S2 will be described in detail below.

First, "a first substrate moving step" S201 is conducted. In this step, a plurality of portions, corresponding to the portions for position measurement and pressure measurement, of the first substrate 51 are moved, thereby causing the first substrate 51 to approach and make contact with the second substrate 52. For example, the measurement point of each sensor unit 15, the operation point of each actuator 22, and the measurement point of each measuring unit 61 are arranged on a radial straight line extending from the center of the first substrate 51 (it should be noted that the center of the first substrate 51, the center of the first substrate support portion 11, and the center of the sensor support portion 13 are arranged to coincide with each other); the measurement points of the sensor units 15, the operation points of the actuators 22, and the measurement points of the measuring units 61 are arranged at positions obtained by equally trisecting concentric circles; and the operation points of the actuators 22 and the measurement points of the measuring units 61 are made to coincide with each other.

During when the "first substrate moving step" S201 is carried out, the moving amounts of the actuators 22, the measured values obtained by the measuring units 61 and the measured values obtained by the sensor units 15 are constantly monitored.

Next, "a pressure measuring step" S202 is conducted. In this step, when the first substrate 51 and the second substrate 52 are made to approach each other, the pressure exerted on the first substrate 51 due to the contact of the devices 55 with the second substrate 52 side is measured by the sensor units 15.

Subsequently, "a pressure judging step" S203 is conducted. In this step, it is judged whether or not the value of the pressure exerted on the first substrate 51 is within such a range as to permit bonding of the devices 55 to the adhesive layer 54, on the basis of each sensor unit 15.

In the case where it is judged in the "pressure judging step" S203 that the measured pressure value is increasing and that the measured pressure value is within such a range as to permit bonding of the devices 55 to the adhesive layer 54, namely, in the case where the result of judgment is "Yes", "a motion stopping step" S205 of stopping the approaching motion for the first substrate 51 corresponding to the position of the first substrate 51 where the pressure measurement has been done is carried out. Namely, the operation (motion) of the actuator 22 corresponding to the position of the first substrate 51 where the pressure measurement has been done is stopped. The range permitting the bonding of the devices 55 to the adhesive layer 54, in terms of the pressure value measured by the sensor unit 15, is for example the range of 98 mN to 1.96 N. The pressure value varies depending on the viscosity of the adhesive layer 54 formed on the second substrate 52, and the just-mentioned value applies to an uncured resin layer used in the ordinary device embedding transfer technology (for example, a resist material highly resistant to peeling). Here, though the operation (motion) of the actuator is stopped, "a position measuring step" S206 which will be described later is also being conducted. Therefore, it is preferably to finally determine the operation of stopping the actuator which should be stopped, taking into account the result of "the position measuring step" S206 as well.

In the case where it is judged in "the pressure judging step" S203 that the measure pressure value has not entered such a range as to permit bonding of the devices 55 to the adhesive layer 54, namely, in the case where the result of pressure judgment is "No", "a first substrate approaching motion continuation commanding step" S204 is carried out to command continuation of the approaching motion of the first substrate 51 toward the second substrate 52, and the process returns to "the first substrate moving step" S201. This "first substrate approaching motion continuation commanding step" S204 is conducted only for the actuator 22 concerned.

In addition, "a position measuring step" S206 is conducted together with "the pressure measuring step" S202. In this step, when the first substrate 51 and the second substrate 52 are made to approach each other, the position of stop of the first substrate 51 due to the contact of the device 55 with the second substrate 52 side and the positions of the actuators 22 pressing the first substrate 51 after the contact of the device 55 with the second substrate 52 side, are measured.

Next, "a position judging step" S207 is conducted. In this step, it is judged, on the basis of each measuring step 61, whether or not the difference between the stop position of the first substrate 51 and the position of the actuator 22, i.e., the moving amount of the actuator 22 from the stop position of the first substrate 51, is in such a range that the first substrate 51 and the second substrate 52 can be judged to be parallel to each other.

In the case where it is judged in "the position judging step" S207 that the moving amount of the actuator 22 is within such a range that the first substrate 51 and the second substrate 52 can be judged parallel to each other, namely, in the case where the result of the position judgment is "Yes", "a motion stopping step" S209 is conducted. For example, where the moving amount of the actuator 22 is within the range of 1 to 10 μm, it is judged that the moving amount is within such a range that the first substrate 51 and the second substrate 52 can be judged parallel to each other, and the operation (motion) of the actuator 22 is stopped. The actuator 22 of which the operation is stopped is an actuator such that the moving point of the first substrate 51 is the same point as the measurement point of the measuring unit 61. In this case, "the pressure measuring step" S202 described above is also being conducted. Therefore, it is preferable to finally determine the operation of stopping the actuator to be stopped, taking into account the result of "the pressure measuring step" S202 as well.

On the other hand, in the case where it is judged in "the position judging step" S207 that the moving amount of the actuator 22 from the stop position of the first substrate 51 is not within such a range that the first substrate 51 and the second substrate 52 can be judged to be parallel to each other, i.e., in the case where the result of position judgment is "No", "a first substrate approaching motion continuation commanding step" S208 is conducted to command continuation of the approaching motion of the first substrate 51 toward the second substrate 52, and the process returns to "the first substrate moving step" S201.

Subsequently, "a motion stop judging step" S210 is conducted. In this step, it is judged whether or not the motion stopping conditions are fulfilled at all of the positions of position measurement and the positions of pressure measurement.

In the case where it is judged in "the motion stop judging step" S210 that the motion stopping conditions for the first substrate 51 are fulfilled entirely, i.e., in the case where the result of motion stop judgment is "Yes", the approaching motion of the first substrate 51 is stopped, and "a device bonding step" S3 is entered.

In the case where it is judged in "the motion stop judging step" S210 that even a part of the motion stopping conditions for the substrate 51 is unfulfilled, namely, in the case where the result of motion stop judgment is "No", the process returns to "the first substrate moving step" S201 at the position where the motion stopping conditions for the first substrate 51 is unfulfilled.

Incidentally, when the actuators at other two shafts continue upward motion after the operation (motion) of the actuator 22 at one shaft is stopped, the portion corresponding to the previously stopped actuator at the one shaft is pushed back; therefore, even though the actuator is at rest, the measured value obtained by the measuring unit 61 may be reduced, or the measured value obtained by the sensor unit 15 may be raised. In such a case, it is preferable to follow up such an unintentional change by operating the actuator in the reverse direction, or in the downward direction, so that the difference between the moving amount of the actuator 22 and the measured value obtained by the measuring unit 61 becomes constant or that the measured value obtained by the sensor unit 15 becomes constant.

Next, "the device bonding step" S3 will be described in detail below. First, "a device bond holding step" S301 is conducted. In this step, the condition where the devices 55 are bonded to the adhesive layer 54 is held. For example, where the adhesive layer 54 is composed of an uncured resin layer, the holding time is a period of time until the uncured resin layer is cured. As a criterion of the curing, the adhesive layer 54 is cured to such a condition where, when the first substrate 51 is separated away from the devices 55 bonded to the adhesive layer 54, the devices 55 would not be bonded to the adhesive layer 53 on the first substrate 51 side. Namely, the adhesive force of the adhesive layer 54 for adhesion to the devices 55 is regulated to be higher than that of the adhesive layer 53.

Subsequently, "a substrate separating step" S302 is conducted. In this step, in the condition where the devices 55 are bonded to the adhesive layer 54, the first substrate 51 is quickly separated away from the second substrate 52 so as to separate the devices 55 from the first substrate 51. The separating speed depends on the adhesive forces of the adhesive layers, and is, for example, not less than 0.1 mm/s. As a result, the devices 55 having been bonded to the first substrate 51 are bonded to the second adhesive layer 54 formed on the second substrate 52. Here, it is necessary that the adhesive force of the first adhesive layer 53 on the first substrate 51 for adhesion to the devices 55 is weaker than the adhesive force of the second adhesive layer 54 on the second substrate 52 for adhesion to the devices 55. For example, it suffices for the first adhesive layer 53 formed on the first substrate 51 to have an adhesive force on such a level that the devices 55 would not move when the first substrate 51 is moved. It is unnecessary that the devices 55 are firmly bonded to the first substrate 51 by the first adhesive layer 53 formed on the first substrate 51.

In the device transferring method as above, after the first substrate 51 and the second substrate 52 are made to approach each other, the position of the first substrate 51 is so regulated as to make the first substrate 51 and the second substrate 52 parallel to each other while keeping at least a part of the plurality of devices 55 bonded to the first substrate 51 in contact with the adhesive layer 54 formed on the second substrate 52, so that it is possible to easily arrange the first substrate 51 and the second substrate 52 in parallel to each other. Therefore, it is possible to bond all the plurality of devices 55 to the adhesive layer 54, for example, to a uniform depth in the adhesive layer 54, in parallel to the second substrate 52. In this case, since the first substrate 51 and the second substrate 52 are set parallel to each other, the substrates would not make contact with each other. Therefore, the devices 55 on the first substrate 51 side can be pressed against the second substrate 52 side, without damaging the second substrate 52. Accordingly, enhancement of the yield in the device transfer technology can be contrived.

Besides, in the device transferring method, once the devices 55 bonded to the first substrate 51 are brought into contact with the second substrate 52 side by the operations (motions) of the actuators 22, the moving amounts of the actuators 22 are compensated for by contraction amounts of the elastic portions 31. In other words, since the first substrate 51 is in contact with the second substrate 52 side through the devices 55 therebetween, the first substrate 51 is prevented from moving further upwards. Therefore, the moving amounts of the actuators 22 are compensated for by the contraction amounts of the elastic portions 31. In short, the first substrate 51 does not show an upward movement, though the actuators 22 do show upward motions. Thus, when the moving amounts of the actuators 22 from the reference positions of the actuators 22 reach predetermined moving amounts, the parallelism between the first substrate 51 and the second substrate 52 is thereby secured. Simultaneously, it is possible to press the devices 55 on the first substrate 51 against the second substrate 52 side with an appropriate pressure, so that the devices 55 can be embedded into the adhesive layer 54 formed on the second substrate 52, with an appropriate embedding depth. By this it is possible to bond the devices 55 to the adhesive layer 54 assuredly.

The device transferring method as above can be performed repeatedly. Now, a method in which the device transferring method is carried out repeatedly will be described referring to the flowcharts shown in FIGS. 5 and 6.

Figure 5:
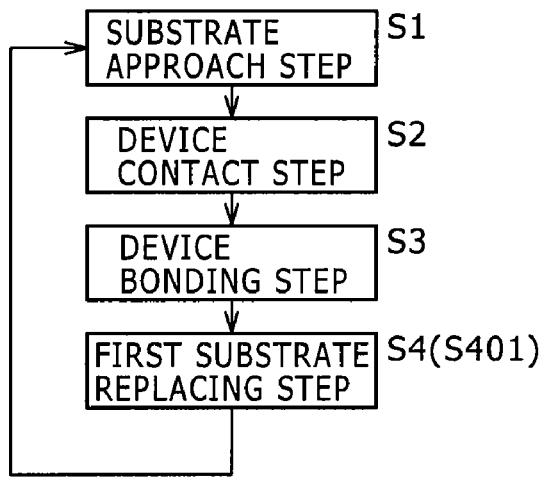
FIG. 5 shows a flowchart and a schematic configuration sectional diagram showing an example of an embodiment of the device transferring method in the present invention.

As shown in FIG. 5, after "the substrate approach step" S1, "the device contact step" S2 and "the device bonding step" S3 are sequentially conducted, "a first substrate replacing step" S4 (S401) is carried out. In this step, the first substrate 51 having been used for device transfer is replaced by a first substrate 51 with new devices 55 bonded thereto, and then "the substrate approach step" S1, "the device contact step" S2 and "the device bonding step" S3 are sequentially conducted, whereby the new devices 55 (552) are bonded to a region, different from the bonding region of the devices 55 (551) previously bonded to the second adhesive layer 54, on the second substrate 52.

Furthermore, "the first substrate replacing step" S4 (S401), "the substrate approach step" S1, "the device contact step" S2 and "the device bonding step" S3 are carried out repeatedly, whereby the devices 55 can be transferred to a wide region on the second substrate 52.

Figure 6:
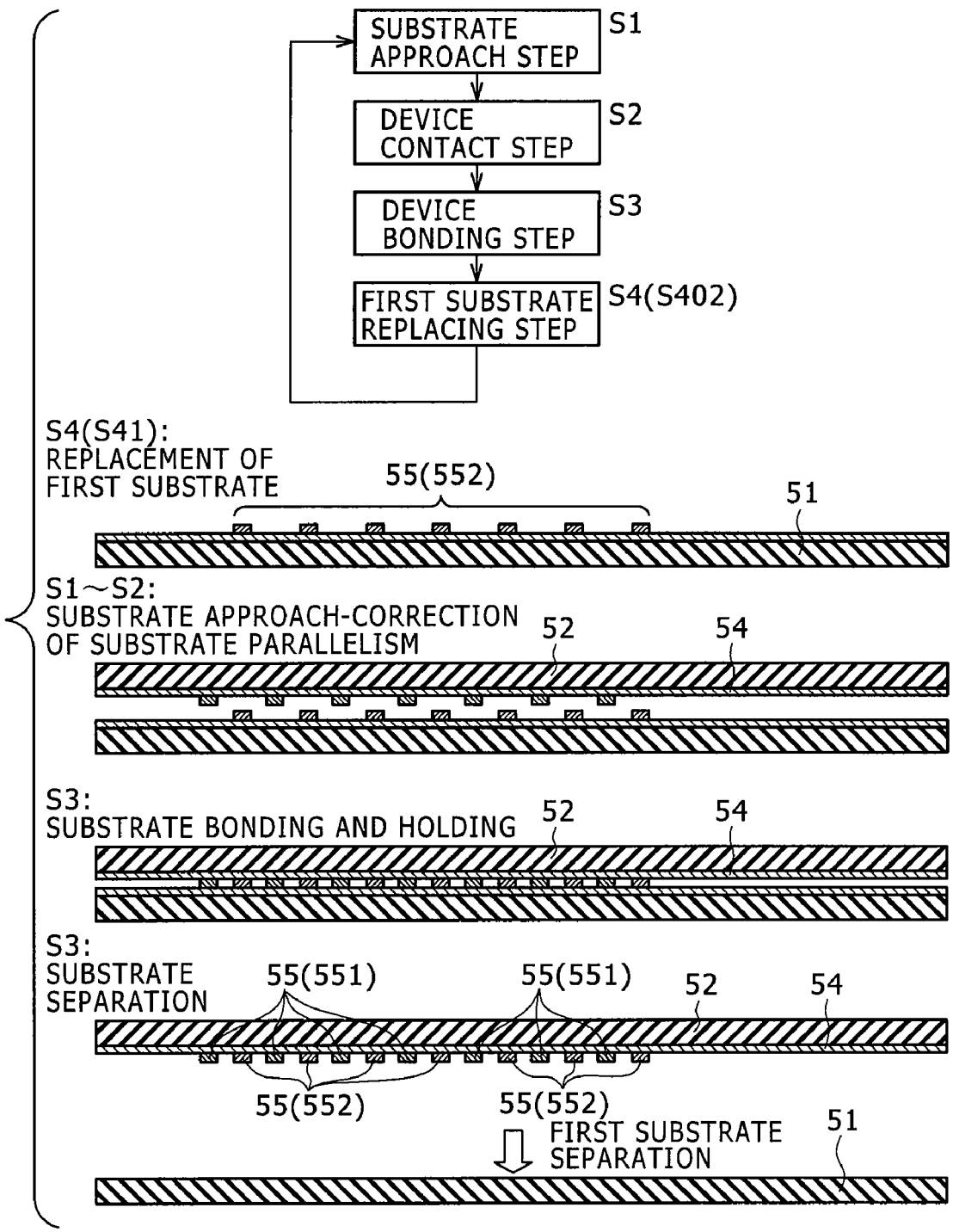
FIG. 6 shows a flowchart and a schematic configuration sectional diagram showing an example of an embodiment of the device transferring method in the present invention.

In addition, as shown in FIG. 6, after "the substrate approach step" S1, "the device contact step" S2 and "the device bonding step" S3 are sequentially conducted, "a first substrate replacing step" S4 (S402) is carried out. In this step, the first substrate 51 previously used for device transfer is replaced by a new first substrate 51 to which new devices 55 (552) are bonded at positions different from the positions of the devices bonded to the previously used first substrate 51. Then, "the substrate approach step" S1, "the device contact step" S2 and "the device bonding step" S3 are sequentially conducted using the new first substrate 51. By this, the new devices 55 (552) can be bonded to the second adhesive layer 54 on the second substrate 52 at positions different from the bonding positions of the previously bonded devices 55 (551), in the bonding region of the devices 55 (551) previously bonded to the second adhesive layer 54. In other words, different kind devices can be transferred to a predetermined region.

Further, "the first substrate replacing step" S4 (S402), "the substrate approach step" S1, "the device contact step" S2 and "the device bonding step" S3 are repeated, whereby a plurality of kinds of devices can be transferred to a predetermined region on the second substrate 52.

Now, the display manufacturing method in the present invention will be described below referring to the manufacturing step diagrams shown in FIG. 7. In FIG. 7, explanation will be made of a display manufacturing method in which light emitting devices bonded to a first substrate are bonded to an adhesive layer formed on a second substrate to thereby arrangingly mounting a plurality of light emitting devices. Specifically, explanation will be made of a display manufacturing method for mounting red light emitting devices 55R, green light emitting devices 55G, and blue light emitting devices 55B.

Figure 7A:
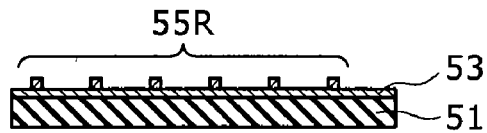
FIGS. 7A to 7F are manufacturing step diagrams showing an example of an embodiment of the display manufacturing method in the present invention.
Figure 7B:
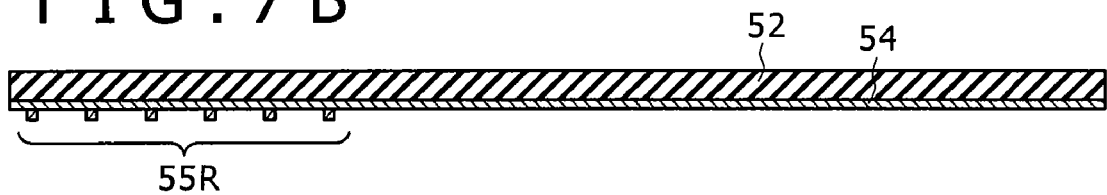
Figure 7C:
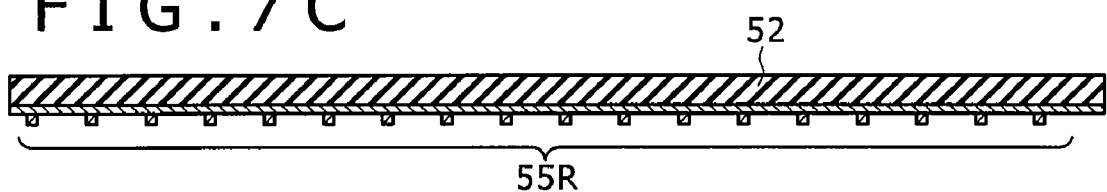

As shown in FIG. 7A, a first substrate 51 with the red light emitting devices 55R bonded to predetermined positions of a first adhesive layer 53 is used as the first substrate 51. Next, as shown in FIG. 7B, the red light emitting devices 55R bonded to the first substrate 51 side are bonded and transferred to a second adhesive layer 54 formed on the second substrate 52, by the above-described device transferring method in the present invention. Then, as shown in FIG. 7C, the red light emitting devices 55R are bonded and transferred to the whole area of the predetermined region of the second substrate 52, as has been described referring to FIG. 5.

Figure 7D:
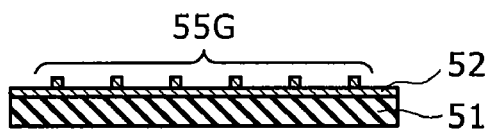
Figure 7E:
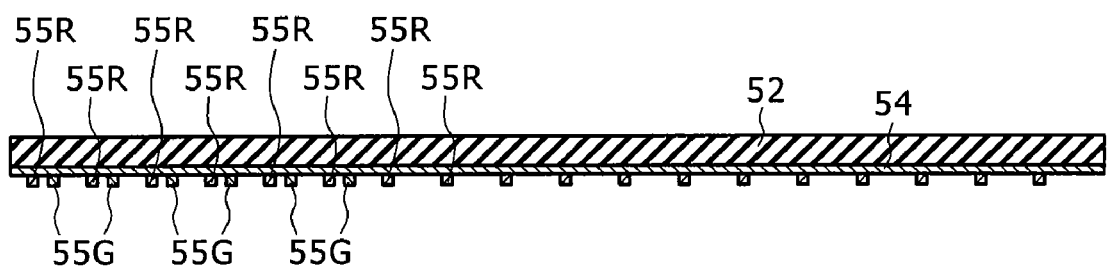
Figure 7F:
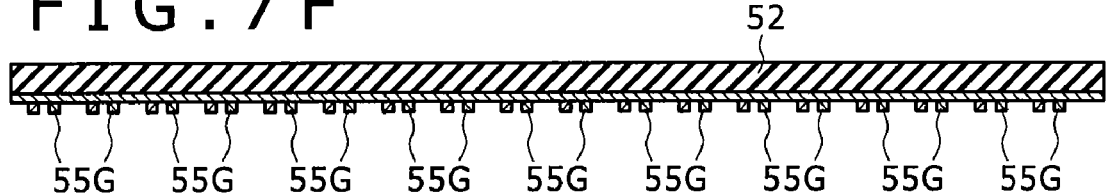
Figure 8A:
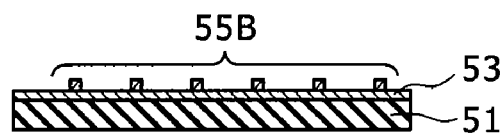
FIGS. 8A to 8C are manufacturing step diagrams showing an example of an embodiment of the display manufacturing method in the present invention.

Next, as shown in FIG. 7D, a first substrate 51 with the green light emitting devices 55G bonded to predetermined positions of a first adhesive layer 53 is used as the first substrate 51. Next, as shown in FIG. 7E, the green light emitting devices 55G bonded to the first substrate 51 side are bonded and transferred to the second adhesive layer 54 formed on the second substrate 52, by the above-described device transferring method in the present invention. In this case, as shown in FIG. 7F, the new green light emitting devices 55G are bonded to the Sedona adhesive layer 54 at predetermined positions different from the bonding positions of the previously bonded red light emitting devices 55R, by the method as described above referring to FIG. 6. Then, as shown in FIG. 8A, the green light emitting devices 55G are bonded and transferred to the whole area of a predetermined region of the second substrate 52, by the method described above referring to FIG. 5.

Figure 8B:
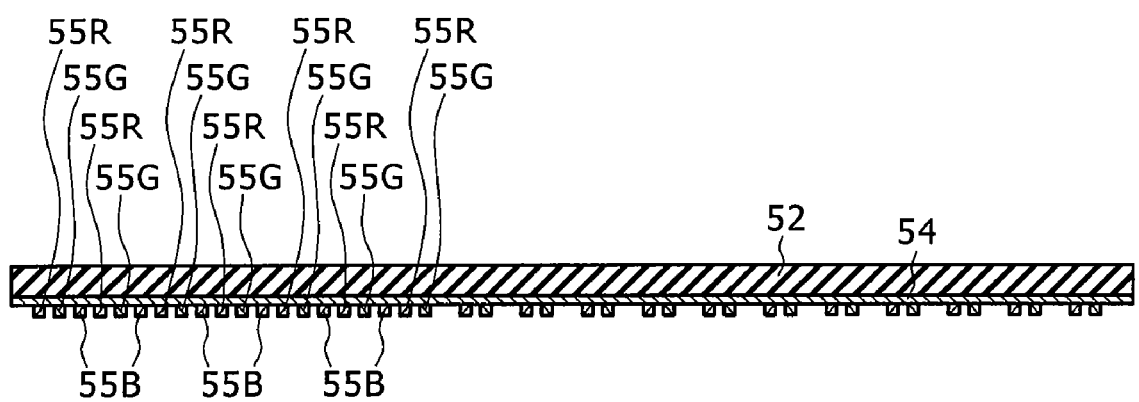
Figure 8C:
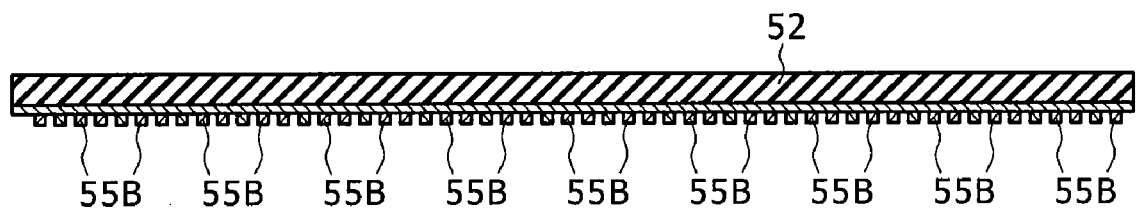

Subsequently, as shown in FIG. 8B, a first substrate 51 with the blue light emitting devices 55B bonded to predetermined positions of a first adhesive layer 53 is used as the first substrate 51. Next, as shown in FIG. 8C, the blue light emitting devices 55B bonded to the first substrate 51 side are bonded and transferred to the second adhesive layer 54 formed on the second substrate 52, by the above-described device transferring method in the present invention. In this case, as shown in FIG. 7F, the new blue light emitting devices 55B are bonded to the second adhesive layer 54 at predetermined positions different from the bonding positions of the previously bonded red light emitting devices 55R and green light emitting devices 55G, by the method described above referring to FIG. 6. Then, as shown in FIG. 8A, the blue light emitting devices 55B are bonded and transferred to the whole area of a predetermined region of the second substrate 52, by the method described above referring to FIG. 5.

In this manner, the color light emitting devices (the red light emitting devices 55R, the green light emitting devices 55G, and the blue light emitting devices 55B) for use in a display can be transferred from the first substrates 51 to the second substrate 52.

In the display manufacturing method in the present invention, at the time of transferring the devices 55 on the first substrate 51 side to the second substrate 52 side, the first substrate 51 and the second substrate 52 are kept parallel to each other, so that the substrates would not make contact with each other. Therefore, the devices 55 on the first substrate 51 side can be pressed against the second substrate 52 side, without damaging the second substrate 52. Accordingly, enhancement of the yield in manufacturing a display by the technology of transferring the devices 55 can be contrived.

The present invention is not limited to the details of the above-described preferred embodiments. The scope of the invention is defined by the appended claims and all changes and modifications as fall within the equivalence of the scope of the claims are therefore to be embraced by the invention.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A device transferring method for bonding a plurality of devices bonded to a first substrate to an adhesive layer formed on a second substrate, comprising the steps of:
   approaching said plurality of devices bonded to said first substrate to approach said adhesive layer formed on said second substrate;
   regulating the position of said first substrate to make said first substrate parallel to said second substrate while keeping at least a part of said plurality of devices bonded to said first substrate in contact with said adhesive layer formed on said second substrate, thereby to bring all of said plurality of devices into contact with said adhesive layer;
   bonding said plurality of devices bonded to said first substrate to said adhesive layer formed on said second substrate in the condition where said devices are in contact with said adhesive layer,
   for bonding to said second substrate said plurality of devices bonded to said first substrate, wherein
   said method is carried out by using a device transferring system which includes:
   a first substrate support portion on which to mount said first substrate;
   a second substrate support portion for supporting said second substrate disposed oppositely to said first substrate;
   a swinging unit for regulating the position of said first substrate so that said devices bonded to said first substrate make contact with the second substrate side in parallel to said second substrate side;
   a movable stage for supporting and moving said swinging portion;
   a sensor unit for sensing the condition where said devices bonded to said first substrate have made contact with said second substrate side, said sensor portion provided between said first substrate support portion and a sensor support portion formed on said swinging unit side; and
   a measuring unit for measuring the position of stop of a motion of said first substrate when said first substrate is made to approach said second substrate, and for measuring the moving amount of said swinging unit after said first substrate is stopped.

2. The device transferring method as set forth in claim 1, wherein
   said substrate approach step includes the steps of:
   carrying out such alignment as to oppose said first substrate to a predetermined position of said second substrate; and
   arranging said first substrate and said second substrate so that said first substrate is disposed within a predetermined range from a reference position obtained by preliminarily measuring the position of contact between said first substrate serving as a reference and said second substrate serving as a reference.

3. A device transferring method for bonding a plurality of devices bonded to a first substrate to an adhesive layer formed on a second substrate, comprising the steps of:
   approaching said plurality of devices bonded to said first substrate to approach said adhesive layer formed on said second substrate;
   regulating the position of said first substrate to make said first substrate parallel to said second substrate while keeping at least a part of said plurality of devices bonded to said first substrate in contact with said adhesive layer formed on said second substrate, thereby to bring all of said plurality of devices into contact with said adhesive layer;
   bonding said plurality of devices bonded to said first substrate to said adhesive layer formed on said second substrate in the condition where said devices are in contact with said adhesive layer, wherein
   in said device contact step,
   the contact of said devices bonded to said first substrate with the second substrate side is detected by measuring the pressure generated upon contact of said devices bonded to said first substrate with the second substrate side and exerted on said first substrate,
   by use of a sensor unit for sensing the contact of said devices bonded to said first substrate with the second substrate side by measuring said pressure exerted on said first substrate;
   a swinging unit including actuators for lifting said first substrate while supporting positions, corresponding to apexes of a triangle, on a surface of said first substrate, and elastic portions each provided between each said actuator and the first substrate side, is used, and when said actuators are operated in the directions for pressing said first substrate against the second substrate side,
   the positions of said actuators upon contact of said devices bonded to said first substrate with the second substrate side are obtained as actuator reference positions; and
   the moving amounts of said actuators upon the operations of said actuators are measured, and the moving amounts of said actuators from said reference positions are so regulated that said moving amounts of said actuators from said reference positions are within predetermined ranges, to thereby regulate said first substrate and said second substrate to be parallel to each other.

4. A device transferring method for bonding a plurality of devices bonded to a first substrate to an adhesive layer formed on a second substrate, comprising the steps of:

approaching said plurality of devices bonded to said first substrate to approach said adhesive layer formed on said second substrate;

regulating the position of said first substrate to make said first substrate parallel to said second substrate while keeping at least a part of said plurality of devices bonded to said first substrate in contact with said adhesive layer formed on said second substrate, thereby to bring all of said plurality of devices into contact with said adhesive layer;

bonding said plurality of devices bonded to said first substrate to said adhesive layer formed on said second substrate in the condition where said devices are in contact with said adhesive layer, wherein said device contact step includes the steps of:

moving said first substrate to approach and make contact with said second substrate by moving a plurality of portions corresponding to position measurement and pressure measurement of said first substrate, by use of a sensor unit sensing the contact of said devices bonded to said first substrate with the second substrate side by measuring, the pressure exerted on said first substrate, and by use of a swinging unit including actuators for lifting said first substrate while supporting positions, corresponding to apexes of a triangle, on a surface of said first substrate, and elastic portions each provided between each said actuator and the first substrate side;

measuring the pressure exerted on said first substrate due to the contact of said devices with the second substrate side, when the first substrate is caused to approach said second substrate;

judging whether or not the pressure exerted on said first substrate is within such a range as to permit bonding of said devices to said adhesive layer;

stopping an approaching motion of said first substrate corresponding to the position of said first substrate where said pressure measurement has been performed, in the case where it is judged in said pressure judging step that said measured pressure is increasing and said measured pressure is within such a range as to permit bonding of said devices to said adhesive layer;

commanding continuation of said approaching motion step of said first substrate, in the case where it is judged in said pressure judging step that said measured pressure has not yet entered such a range as to permit bonding of said devices to said adhesive layer;

measuring the position where said first substrate is stopped due to the contact of said devices with the second substrate side and the positions of said actuators for pressing said first substrate after the contact of said devices with the second substrate side when said first substrate and said second substrate are caused to approach each other;

judging whether or not the differences between the stop position of said first substrate and the positions of said actuators are within such ranges that said first substrate and said second substrate can be judged as parallel to each other;

stopping said approaching motion of said first substrate corresponding to the position of said first substrate where said position measurement has been performed, in the case where it is judged in said position judging step that the differences between said stop position of said first substrate and the positions of said actuators are within such ranges that said first substrate and said second substrate can be judged as parallel to each other;

commanding continuation of the approaching motion step of said first substrate, in the case where it is judged in said position judging step that the differences between said stop position of said first substrate and the positions of said actuators are not within such ranges that said first substrate and said second substrate can be judged as parallel to each other; and judging whether or not said motion stopping conditions are fulfilled at all of said position measurement positions and said pressure measurement positions; and in the case where it is judged in said motion stop judging step that all of said motion stopping conditions for said first substrate are fulfilled, said approaching motion of said first substrate is stopped and said device boding step is entered; whereas in the case where it is judged in said motion stop judging step that a part or all of said motion stopping conditions for said first substrate are unfulfilled, said first substrate approaching motion step is re-entered at the position where said motion stopping conditions for said first substrate are unfulfilled.

5. The device transferring method as set forth in claim 1, wherein said device bonding step includes the steps of:

holding the condition where said devices have been bonded to said adhesive layer; and separating said first substrate and said second substrate from each other in the condition where said devices have been bonded to said adhesive layer, to thereby separate said devices from said first substrate.

6. The device transferring method as set forth in claim 1, wherein after said devices bonded to said first substrate are bonded to said adhesive layer formed on said second substrate, a step of replacing said first substrate by a first substrate having new devices bonded thereto is performed, and thereafter said substrate approach step, said device contact step, and said device bonding step are performed, whereby said new devices are bonded to other positions on said second substrate.

7. The device transferring method as set forth in claim 1, wherein after said devices bonded to said first substrate are bonded to said adhesive layer formed on said second substrate, a process in which a step of replacing said first substrate by a first substrate having new devices bonded thereto is performed, and thereafter said substrate approach step, said device contact step, and said device bonding step are performed, whereby said new devices are bonded to other positions on said second substrate, is repeated a plurality of times.

* * * * *